Jan. 14, 1958 G. H. DEWITZ 2,820,109

MAGNETIC AMPLIFIER

Filed March 22, 1952 2 Sheets-Sheet 1

INVENTOR
Gerhard H. Dewitz
BY
Curtis, Morris + Safford
ATTORNEYS

MAGNETIC AMPLIFIER

Filed March 22, 1952 2 Sheets-Sheet 2

INVENTOR
Gerhard H. Dewitz
BY
Curtis, Morris + Safford
ATTORNEYS 2,820,109

MAGNETIC AMPLIFIER

Gerhard H. Dewitz, Westport, Conn., assignor to C. G. S. Laboratories, Inc., Stamford, Conn., a corporation of Connecticut Application March 22, 1952, Serial No. 278,069

15 Claims. (Cl. 179—171)

This invention relates to electrical amplifiers for increasing the amplitude of electrical signals, and more particularly to magnetic amplifiers.

Magnetic amplifiers have a number of advantages over vacuum tube amplifiers, such as rugged construction and practically unlimited life. In spite of these and certain other advantages, magnetic amplifiers of the types heretofore available are satisfactory in only a small proportion of the total number of applications for amplifiers.

For one thing, such magnetic amplifiers are capable of amplifying only low frequency signals. Thus, if the control signal to be amplified contains components of high frequencies, such as are produced when the amplitude of the signal changes suddenly from one value to another, magnetic amplifiers are unable to follow the rapid changes in magnitude, and vacuum tubes or other amplifying means must be utilized. Moreover, the gain of the magnetic amplifier is usually relatively low and multiple stages arranged in cascade usually require a substantial amount of auxiliary and stabilizing apparatus. The use of positive feedback to increase the gain generally increases the response time and decreases the stability.

The present invention overcomes in a large measure these and other limitations of magnetic amplifier systems, and accordingly results in magnetic amplifiers having characteristics suitable for a much wider range of applications.

In accordance with a preferred embodiment of the present invention, two resonant circuits are provided having resonant frequencies substantially higher than the frequencies of the signals that are to be amplified, the two resonant frequencies being sufficiently different to form a frequency discriminator circuit. A magnetic control circuit is arranged to vary simultaneously the resonant frequencies of these circuits in accordance with the magnitude of the control signal that is to be amplified. These resonant circuits, in turn, control the magnitude of a power signal, produced by a constant-frequency source, whose frequency is within the discriminator range of the resonant circuits, so that the magnitude of the output voltage, delivered at the higher frequency, follows the changes in the amplitude of the input control signal.

When this output signal is rectified it results in a signal that is an amplified replica of the input control voltage. For additional amplification, this amplified voltage may be applied to another stage of magnetic amplification similar to or identical with the first stage, and which may be energized, if desired, from the same high frequency generator.

This magnetic amplifier system preferably makes use of ferrite core material, that is, ferro-magnetic ceramic material as is described later, and is capable of efficiently amplifying signals up to several megacycles. The frequencies of the resonant circuits advantageously are varied by changing the extent of the magnetic saturation of this core material. The correlated tuned circuits permit increased amplification with good linearity over a wide range of amplitude and frequencies. In addition, the output circuit of the amplifier acts somewhat as a constant current source and aids in producing substantially flat response over a relatively wide range of frequencies.

Other aspects, objects, and advantages of the invention will be in part apparent from and in part pointed out in the following description considered in conjunction with the accompanying drawings, in which.

Figure 1:
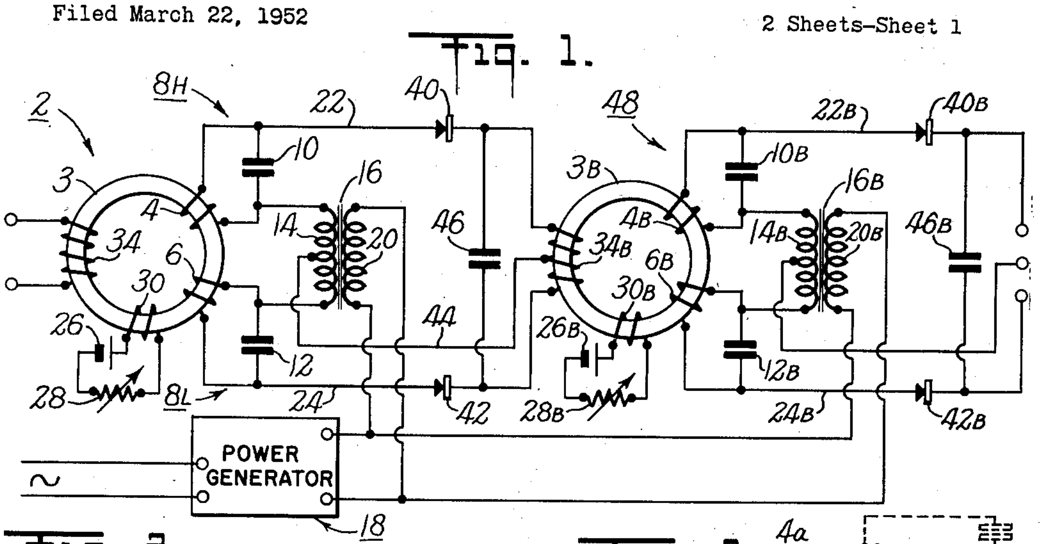
Figure 1 illustrates diagrammatically a magnetic amplifier embodying the present invention.

As shown in Figure 1, a first amplifier stage, generally indicated at 2, includes a ring core 3, preferably formed of ferromagnetic ceramic material such as is described generally in U. S. Patents 2,452,529; 2,452,530; and 2,452,531 of R. L. Snoek. This core carries two identical windings 4 and 6 which form, respectively, the inductive portions of two resonant circuits, generally indicated at 8H and 8L. Two fixed capacitors 10 and 12, connected respectively in parallel with the windings 4 and 6, provide the capacitance elements for the resonant circuits.

These two circuits 8H and 8L are resonant at slightly different frequencies so that their frequency response curves extend over adjacent or overlapping frequency ranges in a manner similar to the resonant circuits of conventional type frequency discriminators.

One end of the winding 4 of the high frequency circuit 8H is connected to one end of a secondary winding 14 of a transformer 16, the opposite end of the secondary winding 14 being connected to one end of the winding 6 of the low frequency discriminator circuit 8L. The winding 14 is energized by means of a high frequency generator, indicated in block form at 18, which is connected to the primary winding 20 of the transformer 16.

The output voltage appearing between two output leads 22 and 24, connected respectively to the electrically opposed ends of the windings 4 and 6, depends upon the relationship between the frequency of the power signal delivered by the high frequency generator 18 and the resonant frequencies of the discriminator circuits 8H and 8L, which are controlled as a function of the magnetic saturation of the core 3. The frequency of the power signal delivered by the constant-frequency generator is selected to be midway between the resonant frequencies of the tuned circuits 8H and 8L when the saturation of the core 3 is at the center of the desired operating range.

In order to bias the saturation of the core 3 at approximately the midpoint of its operating range, a source of direct current, diagrammatically indicated as a battery 26, is connected through a variable resistor 28 to a bias winding 30 on the core 3. Alternatively, the bias can be provided by a permanent magnet field, or in some instances the residual magnetism in the core material may provide a satisfactory bias.

The value of the resistor 28, in the present example, is adjusted so that the output from the two tuned circuits 8H and 8L, connected in opposition, is zero when there is no input signal. Curve 32 of Figure 2 shows the amplitude of the output signal appearing between leads 22 and 24 as a function of frequency, so that if the generator 18 delivers a power signal of the frequency $f_1$, indicated by the vertical broken line in Figure 2, there will be no output voltage from the magnetic amplifier.

However, if the magnetic saturation of the core 3 is varied, for example by changing the magnetic bias current by adjustment of the variable resistor 28, or by the application of a control current to an input control winding 34, the resonant frequencies of the two circuits 8H and 8L will be increased or decreased, depending upon whether the magnetic saturation of the core 3 is decreased or increased.

For purposes of explanation, assume that the value of the resistor 28 is increased so that less current flows through the winding 30 and the magnetic saturation of the core 3 is decreased. This change increases the effective incremental permeability of the core and, therefore, the inductances of windings 4 and 6 and decreases simultaneously the resonant frequencies of both resonant circuits 8H and 8L. That is, the resonant frequency of the circuit 8H has been moved nearer the frequency $f_1$, thus increasing its output voltage, while the resonant frequency of the circuit 8L has been shifted away from the frequency $f_1$ of the power signal delivered by the generator 18, and accordingly its output voltage has decreased. The response is now indicated by the curve 36, an output signal now appearing between the leads 22 and 24 having a magnitude $e_1$, as indicated on the graph of Figure 2.

Figure 2:
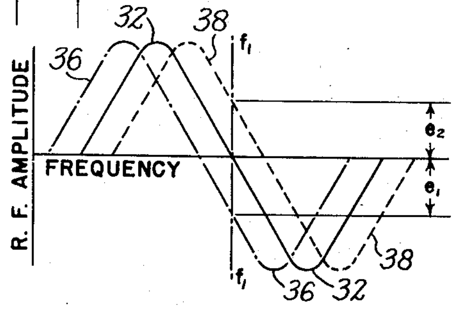
Figure 2 is a graph for assisting in the explanation of the operation of the magnetic amplifier shown in Figure 1.

If, however, the resistor 28 were decreased in value, thus increasing the magnetic flux saturation of the core 3, the effective inductances of the windings 4 and 6 would be decreased, thereby increasing the resonant frequencies of the discriminator circuits 8H and 8L so that their response is represented by the curve 38 in Figure 2. The resonant frequency of the circuit 8L has now been moved nearer the frequency $f_1$ of the generator 18, and accordingly its output voltage has been increased; whereas the voltage delivered by the circuit 8H, whose resonant frequency has been moved farther away from the generator frequency $f_1$, has been decreased. Accordingly, a voltage is delivered between leads 22 and 24 equal to the value $e_2$ as indicated in Figure 2. The zero line in Figure 2, of course, indicates a reversal in phase, denoting that the signal $e_1$ is of opposite polarity from the signal $e_2$ In operation, the signal to be amplified, which may be either a direct current or a signal containing alternating components, is applied to the winding 34 and accordingly causes the resonant frequencies of the circuits 8H and 8L to increase and decrease in accordance with the changes in the magnitude of the applied signal.

The lead 22 is connected through a half-wave rectifier 40, a winding 34B on a second magnetic core 3B, and through a second half-wave rectifier 42 to the lead 24. A lead 44 extends between a center connection on the transformer 14 and a center connection on the winding 34B.

In order to remove the high frequency components from the output signal, a filter condenser 46 is connected across the winding 34B. Thus, the signal current through the winding 34B is an amplified replica of the signal current applied to winding 34.

This signal may again be amplified by a similar magnetic amplifier arrangement, generally indicated at 48, of which the winding 34B is the control winding. The operation of this second stage is identical with that of the first stage, and the corresponding components have been given the same reference characters, with the addition of the suffix B.

Instead of simple resonant circuits, other frequency responsive arrangements can be selected so as to best suit the conditions of a particular use. For example, a high pass and a low pass filter circuit can be used to form the circuit having the desired frequency discriminator characteristics.

Figure 3:
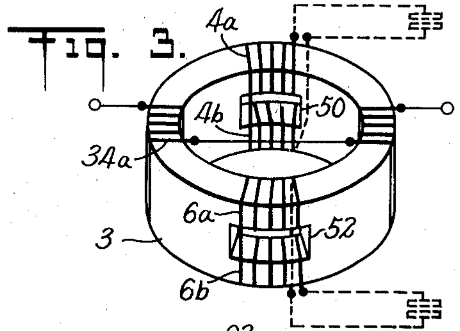
Figure 3 shows a core and winding arrangement suitable for use in the amplifier of Figure 1.

In order to prevent direct coupling between the windings wound on the core 3, at least one of the windings preferably is formed of two sections connected in series opposition. Figure 3 shows a core 3 suitable for use in the magnetic amplifier described above.

The core 3 is formed of ferromagnetic ceramic material and is provided with two holes or slots, indicated at 50 and 52. The slots 50 and 52 can be at any desired angular position relatively to each other, and in this example are positioned diametrically opposite each other primarily as a matter of convenience. The winding 6 is divided into two equal parts, indicated respectively at 6*a* and 6*b*. The winding portion 6*a* is wound through the slot 52 and around one side of the core 3. The winding portion 6*b* also is wound through the slot 52 but around the portion of the core 3 on the other side of the slot 52. These two winding portions 6*a* and 6*b* are connected in series, so that the winding 6 is not coupled to the other windings on the core.

The winding 4, similarly, is formed of two portions 4*a* and 4*b* which are wound through the slot 50 and connected in series.

The control winding 34 is wound on the core in the usual manner and may be divided into two or more sections, as at 34*a* and 34*b*, connected in series.

Figure 4:
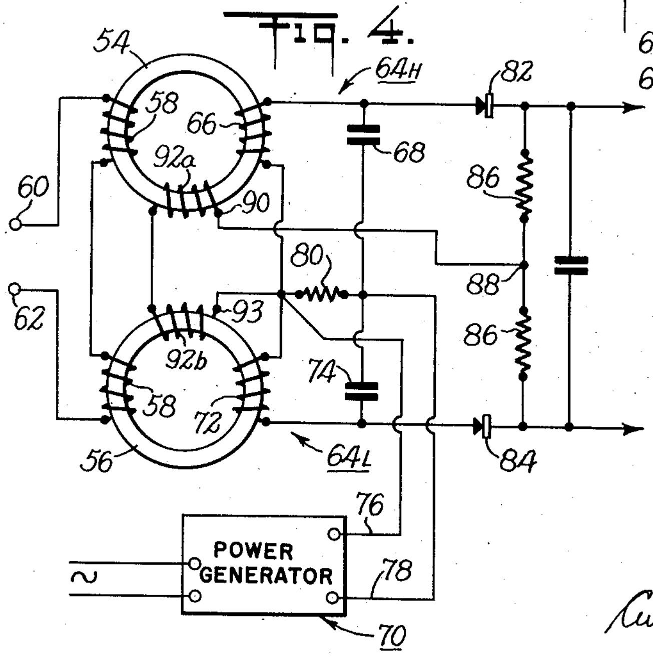
Figure 4 shows another embodiment of the invention utilizing separate saturable cores for the two frequency-responsive circuits.

Figure 4 shows another embodiment of the invention in which two cores, indicated diagrammatically at 54 and 56, are utilized. As in the previous example, these cores may be ring-shaped and formed of ferromagnetic ceramic material. A control winding 58 is wound around both of the cores 54 and 56, and the input signal to be amplified is applied between the terminals 60 and 62 of this winding.

A first resonant circuit generally indicated at 64H, corresponding to the circuit 8H of Figure 1, includes a winding 66 on the core 54, connected to a capacitor 68 to form a circuit having its resonance peak somewhat higher in frequency than the frequency of the power signal delivered by a generator 70.

The other and lower frequency resonant circuit 64L, corresponding to the circuit 8L of Figure 1, includes a winding 72, on the core 56, connected to a capacitor 74 to form a circuit resonant at a frequency somewhat below the frequency of the power signal delivered by the generator 70.

As in the earlier example, these circuits are energized by the high frequency generator 70 whose output leads 76 and 78 are connected across a low value resistor 80 included in each of the resonant circuits 64H and 64L. Obviously, other conventional arrangements can be used for coupling the generator to the frequency-selective circuits.

The voltages developed across the circuits 64H and 64L are applied, respectively, through rectifiers 82 and 84 to opposite ends of two-section load resistor 86, the center tap connection 88 of which is connected to a terminal 90, of a feed-back winding 92, having one portion 92*a* wound on the core 54 and another portion 92*b* on the core 56. The other end of this winding is connected to a terminal 93 and to the common junction of the windings 66 and 72.

The feed-back winding 92 may be arranged to provide either positive or negative feed-back in accordance with the particular application of the device. In the present example, the winding 92 is considered to aid the effect produced by the incoming signal and is accordingly for positive feedback.

Suitable magnetic bias can be provided by the addition of separate bias windings or by a D.-C. current applied to the winding 58 along with the control signal. In some applications, a bias current will not be required, as where the core has been magnetized initially so that the residual magnetism can be allowed to provide the bias level, or where a permanent magnet field is provided.

Figure 5:
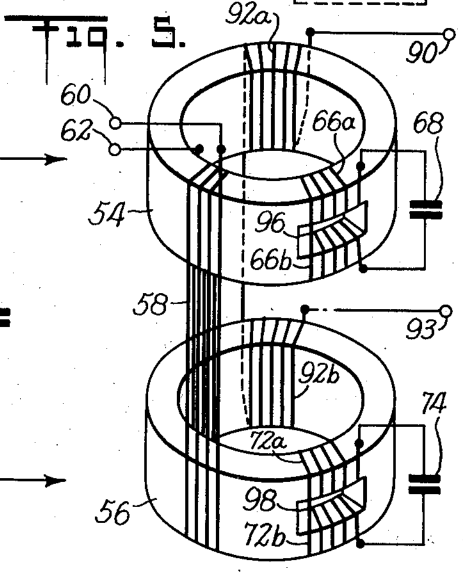
Figure 5 shows a core arrangement suitable for use in the amplifier of Figure 4.

Figure 5 illustrates diagrammatically two cores and their associated windings, which are given reference characters corresponding to those of Figure 4. The winding 66 is divided into two sections 66*a* and 66*b* which are wound through a slot 96 in the core 54 around opposed portions of the core so that any current in these coils produces a closed magnetic field around the slot 96. The winding 72 is divided into two portions 72*a* and 72*b* wound through a slot 98 in the core 56 in a manner similar to the winding 66.

Figure 6:
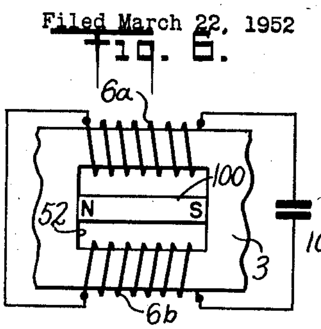
Figure 6 shows another arrangement for providing a magnetic bias.

Figure 6 shows one arrangement for producing the magnetic bias in the ferromagnetic core, as for example in core 3 of Figure 2. A permanent magnet 100 extends longitudinally in the slot 52 with its north and south poles at opposite ends in close contact with the surfaces of core 3. A similar magnetic bias arrangement would also be provided in connection with the other slot 50. Alternatively, the magnetic bias can be provided for the core, as core 2C, by means of a permanent bar magnet placed diametrically across the opening in the toroidal core 2C, or by placing the entire core within an external magnetic field produced by a permanent magnet or by an electromagnet.

Figure 7:
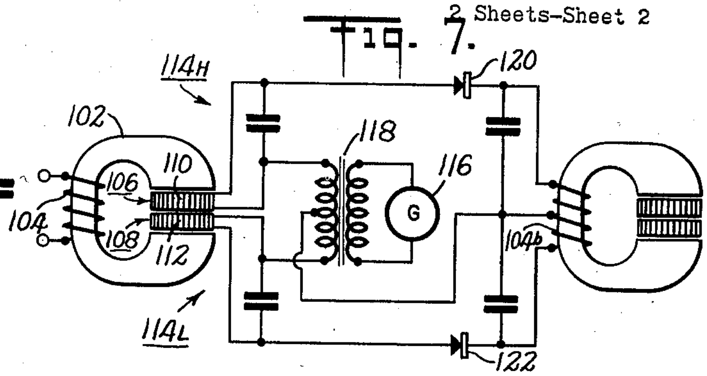
Figure 7 shows a modified amplifier in which the saturation of the toroidal cores is varied by means of an externally-produced magnetic field.

Figure 7 shows another magnetic amplifier that is useful when the signal to be amplified contains only relatively low frequency components. A C-shaped magnetic core 102 is arranged to produce an electromagnetic field between its spaced pole faces. The strength of this field is a function of the signal current which is to be amplified and which flows through a winding 104 on the core 102.

This magnetic field is used to control the saturation of two ring cores, generally indicated at 106 and 108, of saturable ferromagnetic material positioned in the gap of the core 102. These ring cores carry two windings 110 and 112, respectively, which form the inductances of a high-frequency resonant circuit, generally indicated at 114H and a lower-frequency resonant circuit, generally indicated at 114L.

The remainder of this stage is generally similar to those described above, the resonant circuits being energized from a constant-frequency power generator 116 through a transformer 118. The output signal is coupled in push-pull fashion through two rectifiers 120 and 122 into a control winding 104B of a succeeding amplifier stage. The operation is similar to that of the system shown in Figure 4 except that the saturation of the cores 106 and and 108 is controlled by producing an external magnetic field. It is apparent that a single core can be used as in the embodiment of Figure 1 to replace the cores 106 and 108.

Figure 8:
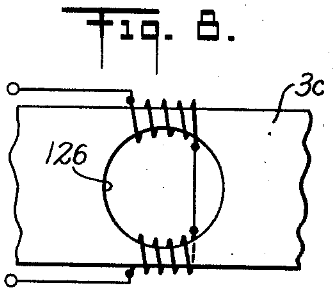
Figure 8 shows a portion of a core having an elliptical opening for modifying the magnetic characteristics of the core.

For many applications, improved amplification characteristics and greater sensitivity can be attained by proper shaping of the slots in the cores. For example, the slots 50 and 52 of the embodiment shown in Figure 2 can be made circular and will produce more nearly linear amplification characteristics. Figure 8 shows a portion of a ring core 3C having a circular opening 126 instead of the rectangular opening such as is shown in Figures 2 and 5. The gradual change in cross-sectional area in the vicinity of the high frequency windings causes different portions of the core to operate on different portions of its characteristic curve, that is, the various portions of the core having different cross-sectional areas approach saturation with different amounts of magnetic flux.

It will be clear that advantageous characteristics can be obtained with many different shapes of openings so long as a gradual change in cross-sectional area is produced. This gradual change in area can be produced also by using a linear slot as is shown in Figure 2, but shaping the core by removing a gradually changing portion of its cross-sectional area along the length of the slot.

Figure 9:
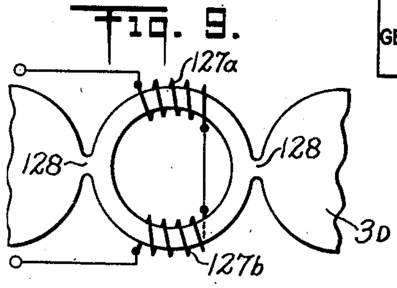
Figure 9 shows another core portion having an elliptical opening and an outer shaped portion for producing different magnetic characteristics and for assisting in localizing the flux produced by windings around this portion of the core.

Figure 9 shows a portion of a ring core 3D in which the two core portions about which the winding is formed are of substantially uniform cross-sectional area, the combined area being substantially less than the cross-sectional area of the other portions of the core. With this arrangement, the core is necked down at each end of the windings 127*a* and 127*b*, as at 128. These portions 128 having the smaller cross-sectional area tend to confine the flux produced by the flow of current through the windings 127*a* and 127*b* to the circular path between the two necked-down portions 128.

Instead of using a saturable core to produce the variation in the resonant frequencies of the discriminator circuit, the capacitances may be varied simultaneously under the control of the signal that is to be amplified. This can be accomplished by using capacitors of a type in which the capacitance can be controlled by varying the voltage stress applied to the dielectric material of the capacitors. Such capacitors may utilize barium salts or other materials as the dielectric material and are well known. See, for example, articles by Dranetz appearing in the April and May 1949 issues of the magazine Tele-Tech at pages 29 and 28, respectively; and an article by Heddish in the October 1948 issue of Wireless Engineer at page 331.

Figure 10:
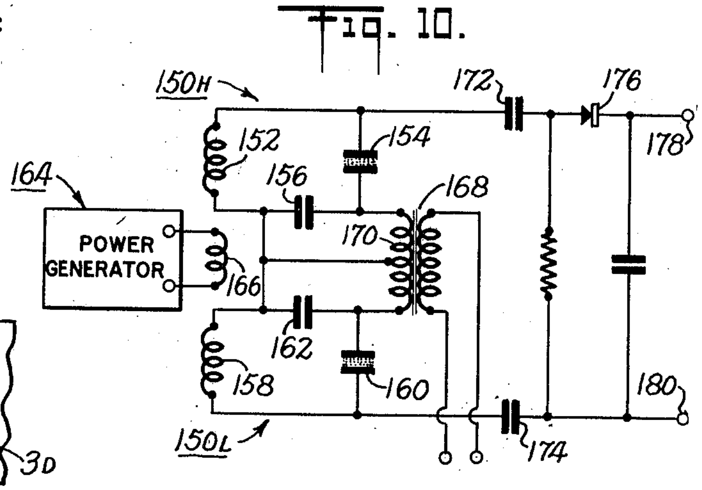
Figure 10 shows another amplifier arrangement in which the frequency response characteristics are controlled by variations in capacitance.

Figure 10 shows such an arrangement in which the higher frequency resonant circuit, generally indicated at 150H, of the discriminator is formed of an inductor 152 and a voltage-sensitive condenser 154 connected in parallel through a blocking condenser 156.

The lower frequency resonant circuit, generally indicated at 150L, is formed of an inductor 158 connected in parallel with a voltage sensitive condenser 160 through a blocking condenser 162.

These resonant circuits 150H and 150L are energized from a high frequency generator 164 which is coupled inductively through a winding 166 to the inductors 152 and 158. The frequency of the voltage supplied by the generator 164 is midway between the resonant frequencies of the circuits 150H and 150L.

In order to vary the resonant frequencies of the circuits 150H and 150L, the capacitance of the capacitors 154 and 160 is varied by varying the voltage between the plates of these condensers by applying thereto the signal to be amplified. This signal is fed through a transformer 168 into a center-tapped secondary winding 170. The signal voltage produced in one-half of the winding 170 is connected across the plates of the blocking condenser 156 and appears between the plates of the capacitor 154.

As in the earlier examples, the frequency of the voltage from the generator 164 is substantially higher than the frequency of the signal to be amplified. The blocking capacitors 156 and 162 are of such values as to offer no significant impedance to the flow of the current supplied by the generator 164, but at the same time to block effectively the flow of the lower frequency currents to be amplified.

In a similar manner, the signal voltage to be amplified that appears across the other half of the transformer winding 170 is applied to the plates of the capacitor 160 so as to vary the resonant frequency of the lower frequency circuit 150L.

The amplified voltage is coupled from the two resonant circuits 150H and 150L through two coupling capacitors 172 and 174 and a half-wave rectifier 176 to the output terminals 178 and 180.

Figure 11:
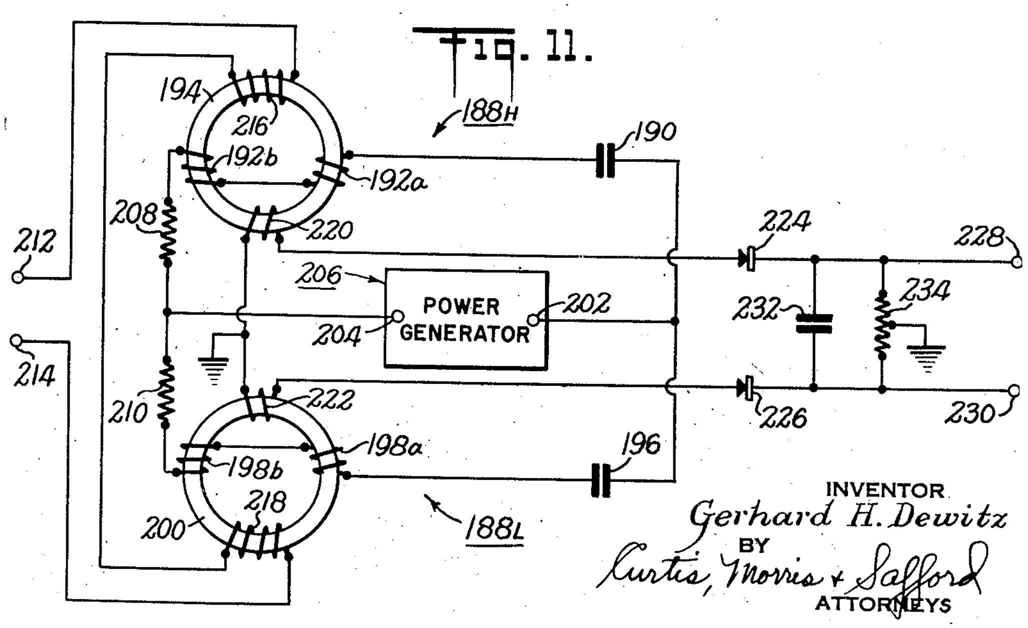
Figure 11 shows another amplifier arrangement utilizing series tuned circuits.

Figure 11 shows another magnetic amplifier using series circuits resonant at different frequencies so as to provide a discriminator characteristic. A first series circuit, generally indicated at 188H, includes a capacitor 190 and an inductive winding 192 formed of two portions **192*a* and 192*b* wound on a ring core 194 of ferromagnetic ceramic or other suitable material. The other series circuit, generally indicated at 188L, resonant at a lower frequency than the circuit 188H, includes a condenser 196 and an inductive winding 198 formed of two portions 198*a* and 198*b* wound on a ring core 200 identical with the core 194**.

The series circuit 188H is connected between the output terminals 202 and 204 of a constant-frequency power generator, indicated in block form at 206, a current-limiting resistor 208 being conected in series with this circuit. The lower frequency circuit 188L is connected in a similar manner and includes a current-limiting resistor 210 identical with the resistor 208.

The signal to be amplified is applied to two input terminals 212 and 214 to which are connected two series control windings 216 and 218 wound, respectively, on the cores 194 and 200. The extent of the magnetic saturation of the cores 194 and 200, thus, varies in accordance with the magnitude of the signal to be amplified.

If the magnitude of the incoming signal increases, the incremental permeability of the cores 194 and 200 decreases, thereby increasing the resonant frequencies of the series circuits 188H and 188L. This brings the resonant frequency of the lower frequency circuit 188L nearer the frequency of the power signal delivered by the generator 206, while the resonant frequency of the other circuit 188H is moved away from the frequency of the power signal. The current through the circuit 188L accordingly increases and the current through the circuit 188H decreases.

Thus, a relatively small change in the magnitude of the current produced by the control signal causes a substantially larger change in the difference between the currents flowing in the two resonant circuits. Accordingly, a signal may be derived that is proportional to the difference in these two currents; for example, by connecting the voltages appearing across the capacitors 190 and 196 in opposition so that the difference voltage constitutes the output signal, or alternatively, by connecting the voltages appearing across the windings 192 and 198 in opposition. Still another arrangement is illustrated in Figure 11, in which a winding 220 on the core 194 couples to the flux produced by the winding portions **192*a* and 192*b*, and is connected in series with a winding 222 on the core 200 which is arranged to couple with the flux produced by the winding portions 198*a* and 198*b*. The voltage induced in windings 220 and 222 is a function of the currents flowing in the respective resonant circuits. The common terminal of the windings 220 and 222 may be connected to the common ground circuit, and the other terminals connected respectively through half-wave rectifiers 224 and 226 to the output terminals 228 and 230. A condenser 232 for by-passing the high frequency current is connected between the output terminals 228 and 230 in parallel with a resistor 234** which is provided with a mid-tap that is connected to the common ground circuit.

From the foregoing, it is apparent that the invention set forth herein is well adapted for the attainment of the ends and objects hereinbefore set forth, and that it is subject to a variety of modifications such that it can be adapted to best suit the conditions of each particular use without exceeding the scope or spirit of the following claims.

It is my intention to claim and to acquire the exclusive rights to every invention disclosed either in the drawings, description, or claims of this application limited only by considerations of the prior art and not by limitations of understanding of the operation of the system or input, language of explanation or the like.

I claim:

1. Apparatus for amplifying an electric signal comprising constant-frequency generating means generating a constant-frequency signal current, first and second frequency-responsive resonant circuits having their resonant frequencies respectively higher and lower than the frequency of said constant-frequency signal and being coupled to said generating means, electrically controllable means in each of said resonant circuits for simultaneously changing in the same direction the resonant frequencies of said circuits by amounts depending upon the magnitude of the signal to be amplified, an input circuit adapted to be connected to an electric signal to be amplified and being coupled to said electrically controllable means and an output circuit coupled to the output of each of said resonant circuits and combining the signals from said first and second resonant circuits in opposition.

2. An amplifier having an input circuit adapted to receive a signal to be amplified, said amplifier comprising a constant-frequency signal source, first and second frequency-selective circuits coupled to said source and having respectively increasing response to signal frequencies higher and lower than the constant-frequency signal from said source, the maximum response of said first circuit being at a frequency higher than the frequency of said constant-frequency signal, the maximum response of said second circuit being at a frequency lower than the frequency of said constant-frequency signal, circuit tuning means coupled to said input circuit and under the control of the signal to be amplified arranged to change simultaneously and in the same directions the frequencies of maximum response of said first and second frequency-selective circuits, thereby to shift the frequency of maximum response of one of said frequency-selective circuits toward the frequency of said source while shifting the frequency of maximum response of the other frequency-selective circuit away from the frequency of said source, and means coupled to said first and second frequency-responsive circuits for rectifying the signals from said first and second circuits and combining the rectified signals in opposition.

3. An amplifier having an input circuit adapted to receive a signal to be amplified, said amplifier comprising a constant-frequency signal source, first and second tuned resonant circuits coupled to said source, the maximum impedance of said first circuit being at a frequency higher than the frequency of said constant-frequency signal, the maximum impedance of said second circuit being at a frequency lower than the frequency of said constant-frequency signal, circuit tuning means coupled to said input circuit and being under the control of the signal to be amplified arranged to change simultaneously and in the same directions the frequencies of maximum impedance of said first and second frequency-selective circuits thereby shifting the frequency of maximum impedance of one of said tuned resonant circuits toward the frequency of said source while shifting the frequency of maximum impedance of the other of said tuned resonant circuits away from the frequency of said source, and means for combining in opposition the signals from said first and second circuits.

4. An amplifier system having an input circuit adapted to be fed an input signal to be amplified, said amplifier system comprising a signal source generating signals of constant frequency, first and second frequency-selective circuits coupled to said source and each including an inductor having a core of magnetically saturable material, said first circuit having gradually increasing impedance to the flow of currents at frequencies progressively lower than the frequency of said source, said second circuit having gradually increasing impedance to the flow of currents at frequencies progressively higher than the frequency of said source, means responsive to the input circuit and under the control of the signal to be amplified for modifying the extent of magnetic saturation of said core material thereby to change simultaneously and in opposite directions the respective impedances of said first and second circuits to the respective flows of current from said constant-frequency source, and output circuit means coupled to said first and second circuits and responsive to said respective current flows.

5. In a magnetic amplifier system for amplifying electrical signals, apparatus comprising a signal source generating signals of constant frequency, first and second frequency-selective circuits coupled to said source and each including a winding having a core of highly permeable ferromagnetic ceramic material, said first circuit having gradually increasing impedance to the flow of currents at frequencies progressively lower than the frequency of said source, said second circuit having gradually increasing impedance to the flow of currents at frequencies progressively higher than the frequency of said source, at least one winding coupled to said core material and to the signal to be amplified and arranged to change the extent of saturation of said core material as a function of the magnitude of the signal to be amplified, thereby to change the inductance of said windings simultaneously and change in opposite directions the impedances of said first and second circuits to their respective energization from said constant-frequency source, and output circuit means coupled to said first and second circuits and responsive to the relative energizations of said first and second circuits.

6. In a magnetic amplifier system for amplifying electrical signals, apparatus comprising an input circuit adapted to be fed by a signal to be amplified, a signal source generating signals of constant frequency, first and second frequency-selective circuits each including a winding having a ring-shaped core of ferromagnetic ceramic material, said first and second circuits having maximum response to frequencies respectively above and below the frequency of the signal delivered by said constant-frequency source and each having gradually decreasing response characteristics at frequencies nearer the frequency of said source, means coupling said circuits to said source, a magnetic field generator coupled to said input circuit and under the control of the signal to be amplified and arranged to vary the magnetic saturation of said core material in accordance with changes in the magnitude of the signal to be amplified, thereby to change simultaneously the inductance of said windings and the frequency response characteristics of said circuits to said constant-frequency signal source, and an output circuit coupled to said first and second frequency-selective circuits and including rectifier means, said output circuit being responsive to the respective amounts of signal from said source appearing in said frequency-selective circuits.

7. A magnetic amplifier comprising an input circuit adapted to receive an input signal to be amplified, a signal generator, first and second frequency-selective circuits coupled to said generator and each including a capacitor and an inductor connected in parallel therewith, said inductors having a core of ferromagnetic ceramic material, the resonant frequency of said circuits being respectively above and below the frequency of the signal produced by said generator, means operatively associated with the input circuit and under the control of the signal to be amplified for modifying the extent of magnetic saturation of said core material thereby to change simultaneously and in the same direction the resonant frequencies of said circuits, and output circuit means coupled to said first and second circuits, said output circuit means including rectifier and filter means connected in opposition and determining the difference in the relative energizations of said circuits by said generator, thereby to produce an amplified replica of the input signal.

8. In a magnetic modulator system, apparatus comprising an input circuit adapted to be energized by an input signal to be amplified, first and second inductors each including a ring core of magnetically saturable material, first and second frequency-selective circuits including respectively said first and second inductors, a source of constant-frequency alternating current coupled to said circuits, said first circuit having gradually increasing impedance to the flow of currents at frequencies progressively lower than the frequency of said alternating current, said second circuit having gradually increasing impedance to the flow of currents at frequencies progressively higher than the frequency of said alternating current, magnetic flux generating means coupled to said input circuit and under the control of the input signal to be amplified for modifying simultaneously the extent of saturation of said cores thereby to modify the response characteristics of said circuits to said alternating current, and output circuit means coupled to said first and second circuits and responsive to the relative energizations of said first and second circuits by said alternating current.

9. In a magnetic modulator system, apparatus comprising an input circuit adapted to be fed by a signal to be amplified, first and second inductors each including a ring core of magnetically saturable material, first and second frequency-selective circuits including respectively said first and second inductors, a source of constant frequency alternating current coupled to said circuits, said first and second circuits having their peak responses to frequencies respectively above and below the frequency of said alternating current, a control winding coupled to said input circuit and encompassing both of said ring cores and adapted to vary the saturation thereof in accordance with the magnitude of the signals to be amplified, and output circuit means coupled to said first and second circuits and responsive to the differences between the magnitudes of the respective alternating current signals fed by said alternating current source into said first and second circuits.

10. An amplifier system comprising an input circuit adapted to be coupled to an input signal to be amplified, first and second tuned frequency selective circuits, each including a winding having ferromagnetic ceramic core material, a generator for generating signals of constant frequency coupled to said circuits, a winding operatively associated with said input circuit and under the control of the input signal to be amplified arranged to change the magnetic saturation of said core material to change the resonant frequencies of said first and second circuits as a function of the magnitude of the signal to be amplified, and output circuit means connected to said first and second circuits, said first circuit being resonant at a higher frequency than said second circuit throughout the range of variation in the magnetic saturation of said core material.

11. Apparatus for amplifying a first electric signal comprising a signal source generating a second signal of a fixed and higher frequency than said first signal, two tuned circuits resonant at frequencies spaced respectively above and below the frequency of said second signal coupled to said signal source, an input circuit adapted to be fed by said first signal and simultaneously varying the resonant frequencies of said tuned circuits to maintain their resonant-frequency spacing substantially uniform while moving one of the resonant frequencies closer to the frequency of said second signal and moving the other furtser away from the frequency of said second signal in accordance with the instantaneous magnitude of the first signal to be amplified, and an output circuit coupled to said tuned circuits and rectifying and combining in opposition the portions of the second signal fed into said two tuned circuits, thereby obtaining an amplified replica of said first signal.

12. Frequency-responsive controllable-inductance system comprising an input circuit adapted to have a varying signal fed thereto, controllable inductance apparatus having first and second portions of ferrite magnetically saturable core material and each having a transverse slot therein, first and second controllable inductance windings wound on said first and second core portions, respectively, said first inductance winding being formed of two sections connected in series and extending through one of said slots and around opposed portions of said first core portion, said second inductance winding being formed of two sections connected in series and extending through the other of said slots and around opposed portions of said second core portion, first and second condensers connected respectively with said first and second inductance windings to form first and second resonant circuits, said first resonant circuit having its resonant peak at a frequency higher than the resonant peak of said second circuit, an alternating current signal source producing an alternating current signal of frequency higher than the highest frequency component of the varying signal in said input circuit, circuit means passing the signal from said signal source through said first resonant circuit and through said second resonant circuit, a third winding magnetically coupled to said first and second core portions and responsive to the varying signal in said input circuit, said third winding simultaneously varying the magnetic saturation of both of said core portions as a function of said varying signal in the input circuit, and an output circuit coupled to the outputs of said first and second resonant circuits, said output circuit including rectification and filter means combining the output signals from said first and second resonant circuits in opposition.

13. A frequency-responsive controllable inductance system comprising an input circuit adapted to have a varying signal fed thereto, controllable inductor apparatus having first and second core portions of magnetically saturable material and each having a transverse slot therethrough, first and second controllable inductance windings wound on said first and second core portions, respectively, said first inductance winding being formed of two sections connected in series and extending through one of said slots and around opposed portions of said first core portion, said second inductance winding being formed of two sections connected in series and extending through the other of said slots and around opposed portions of said second core portion, a first and second condensers connected respectively with said first and second inductance windings to form first and second resonant circuits, said first resonant circuit having is resonant peak at a frequency higher than the resonant peak of said second circuit, an alternating current signal source producing an alternating current signal of frequency higher than the highest frequency component of the varying signal in said input circuit, circuit means passing the signal from said signal source through said first resonant circuit and through said second resonant circuit, a third winding magnetically coupled to said first and second core portions and responsive to the varying signal in said input circuit, said third winding simultaneously varying the magnetic saturation of both of said core portions as a function of said varying signal in the input circuit, an output circuit coupled to the outputs of said first and second resonant circuits, said output circuit including rectification and filter means combining the output signals from said first and second resonant circuits in opposition, a fourth winding magnetically coupled to said first and second core portions and coupled to said output circuit and feeding back energy from the output circuit and simultaneously varying the magnetic saturation of both said core portions as a function of the signal in the output circuit.

14. A frequency-responsive controllable inductance system including an input circuit adapted to receive an alternating signal, controllable inductance apparatus including first and second core portions of magnetically saturable material, each of said core portions including an elongated slot therein, first and second inductive windings carried on said first and second core portions, respectively, and each wound through the slot therein, first and second capacitors connected in parallel with said first and second inductive windings, respectively, forming first and second resonant circuits tuned to different resonant frequencies, control winding means responsive to the input circuit and simultaneously varying the magnetic saturation of said first and second core portions as a function of the alternating signal in the input circuit, a source of an alternating signal having a frequency intermediate said resonant frequencies and being coupled to one side of each of said capacitors, first and second rectifier means coupled to the other sides of each of said capacitors, and third capacitor means effectively coupling the output of said first and second rectifier means in opposition.

15. A frequency-responsive controllable inductance system as claimed in claim 14 and wherein said third capacitor includes impedance means connected thereacross having a center tap connection, and feed-back circuit means connected to said center-tap connection and arranged to vary the magnetic saturation of said first and second core portions as a function of the output signal at said center-tap connection.

References Cited in the file of this patent

UNITED STATES PATENTS

| | | |
|---|---|---|
| 1,794,932 | Usselman | Mar. 3, 1931 |
| 2,057,640 | Conrad | Oct. 13, 1936 |
| 2,191,315 | Guanella | Feb. 20, 1940 |
| 2,200,263 | Kramolin | May 14, 1940 |
| 2,435,547 | Nikis | Feb. 3, 1948 |
| 2,503,039 | Glass | Apr. 4, 1950 |
| 2,585,532 | Briggs | Feb. 12, 1952 |
| 2,607,860 | Skillman | Aug. 19, 1952 |
| 2,657,281 | Kulz | Oct. 27, 1953 |

FOREIGN PATENTS

| | | |
|---|---|---|
| 481,255 | Great Britain | Mar. 8, 1938 |